United States Patent
Ye et al.

(10) Patent No.: US 9,978,917 B1
(45) Date of Patent: May 22, 2018

(54) LIGHT-EMITTING DIODE PACKAGE STRUCTURE HAVING PLANE LIGHT SOURCE AND METHOD FOR MANUFACTURING THE SAME

(71) Applicant: HARVATEK CORPORATION, Hsinchu (TW)

(72) Inventors: Zhi-Ting Ye, Hsinchu (TW); Shyi-Ming Pan, Hsinchu (TW)

(73) Assignee: Harvatek Corporation, Hsinchu (TW)

( * ) Notice: Subject to any disclaimer, the term of this patent is extended or adjusted under 35 U.S.C. 154(b) by 0 days. days.

(21) Appl. No.: 15/591,527

(22) Filed: May 10, 2017

(30) Foreign Application Priority Data

Mar. 31, 2017   (TW) .............................. 106204647 U

(51) Int. Cl.
| | |
|---|---|
| *H01L 33/00* | (2010.01) |
| *F21K 99/00* | (2016.01) |
| *F21V 3/04* | (2018.01) |
| *H01L 33/60* | (2010.01) |
| *H01L 33/58* | (2010.01) |

(52) U.S. Cl.
CPC .............. *H01L 33/60* (2013.01); *H01L 33/58* (2013.01); *H01L 2933/0016* (2013.01); *H01L 2933/0058* (2013.01)

(58) Field of Classification Search
CPC ........ F21K 9/00–9/278; H01L 2924/00; H01L 2224/48091; H01L 2924/00014; H01L 33/60
USPC .......... 257/98, 99, E33.067; 362/606, 296.01
See application file for complete search history.

(56) References Cited

U.S. PATENT DOCUMENTS

| | | | |
|---|---|---|---|
| 8,957,446 B2* | 2/2015 | Tu .............................. | F21K 9/52 257/98 |
| 2011/0063855 A1* | 3/2011 | Vissenberg .......... | G02B 6/0021 362/311.12 |

* cited by examiner

*Primary Examiner* — Jonathan Han
(74) *Attorney, Agent, or Firm* — Rosenberg, Klein & Lee

(57) ABSTRACT

The present invention provides a light-emitting diode (LED) package structure and the method for manufacturing the same. First, a ceramic substrate is provided. Then, an ultraviolet (UV) LED chip, a light-guiding layer, and a metal reflective layer are disposed on the substrate sequentially. By means of the metal reflective layer, the emission light of the UV LED from the light-emitting side is reflected laterally and thus making the UV LED package structure output a plane light source.

7 Claims, 10 Drawing Sheets

LIGHT-EMITTING DIODE PACKAGE STRUCTURE HAVING PLANE LIGHT SOURCE AND METHOD FOR MANUFACTURING THE SAME

FIELD OF THE INVENTION

The present invention is related generally to a package structure and the method for manufacturing the same, and particularly related to a light-emitting diode package structure having a plane light source and the method for manufacturing the same. The present invention provides an ultraviolet plane light source.

BACKGROUND OF THE INVENTION

A light-emitting diode (LED) is a semiconductor electronic device capable of emitting light. It owns the advantages of saving power, high efficiency, rapid response time, long lifetime, containing no mercury, and environmental benefits. In recent years, it has been applied to lighting extensively. For general LED packaging, in addition to protecting LED chips, the requirement in light transmittance results in special requests in materials, package methods, and structures. LEDs are developed from early visible-light LEDs all the way to invisible-light LEDs. In particular, ultraviolet (UV) LED products are mainly applied to the light curing market. Compared to traditional light curing, UV LED light curing has better curing efficiency. For example, the intensity (W) and energy (J) of UV LEDs are superior to traditional curing light sources. The UV intensity is stronger. Besides, due to the faster curing and solidification speed by using UV LEDs as the curing light source, the involvement of UV LEDs in the curing market grows up rapidly.

Moreover, UV LEDs can be further applied to antibiosis, preventing dusts, purification, sterilization, and other similar biochemical applications given their superior efficacy. In addition, due to their advantages of small size, long lifetime, and low power consumption, the application fields of UV LEDs have gone beyond the light curing market and to home appliances, such as air purifiers, water purifiers, refrigerators, air conditioners, and dishwashers, and medical apparatuses and the likes. They have gradually become indispensable devices in daily lives.

Nonetheless, instead of plane light sources, current LED package structures are generally point light sources. Considering the indexes of refraction of the materials, it does easily cause that a total reflection is occurred in package structures, the design for plane light sources is a challenge. Besides, UV light has short wavelengths, which means it carries higher energy. For the light field of point light sources, the energy will be more concentrated. Thereby, extra optical components are required for UV LEDs to diffuse UV light for avoiding excessively concentrated energy, which might lead to uncontrollable conditions, such as excessive illumination during light curing.

Accordingly, for solving the above problems, the present invention provides an LED package structure having a plane light source and the method for manufacturing the same. The lateral light emission of the package structure is improved and hence forming a plane light source and making the UV energy distributed more uniformly.

SUMMARY

An objective of the present invention is to provide an LED package structure having a plane light source and the method for manufacturing the same for providing lateral light emission of UV LEDs and forming an UV plane light source.

Another objective of the present invention is to provide an LED package structure having a plane light source and the method for manufacturing the same for providing an UV plane light source and avoiding excessive concentration of UV energy by dispersion.

To achieve the above objectives, the present invention provides an LED package structure having a plane light source, which comprises a ceramic substrate, an aluminum layer, an UV LED chip, a glass glue layer, a light-guiding layer, and a metal reflective layer. The UV LED chip is disposed on the aluminum layer; the light-guiding layer covers the UV LED chip; and the metal reflective layer covers the light-guiding layer. Hence, the front light emission of the UV LED is guided to the metal reflective layer via the light-guiding layer and then reflected from the metal reflective layer to the lateral sides of the package structure, and thus exhibiting the light field of a plane light source.

According to an embodiment of the present invention, the LED package structure further comprises two electrodes connected electrically to the ceramic substrate.

According to an embodiment of the present invention, the LED package structure further comprises a transparent member disposed on one side of the metal reflective layer, the transparent member is doped with at least one fluorescent particle.

According to an embodiment of the present invention, the UV LED chip is a flip-chip LED.

The present invention provides a method for manufacturing the LED package structure. First, a ceramic substrate is provided. Then, an aluminum layer covers the ceramic substrate, and a UV LED chip is disposed on the aluminum layer. Next, a glass glue layer is provided to cover the aluminum layer and be adjacent to the UV LED chip, and a light-guiding layer is provided to cover the UV LED chip and the glass glue layer. Afterwards, a metal reflective layer is provided to cover the light-guiding layer. Hence, the light emission of the UV LED is guided to the metal reflective layer via the light-guiding layer and then reflected by the metal reflective layer to the lateral sides of the package structure, and thus exhibiting the light field of a plane light source.

According to an embodiment of the present invention, the method for manufacturing further comprises a step of disposing a transparent member on the light-guiding layer and locating the transparent member at one side of the metal reflective layer, the transparent member is doped with at least one fluorescent particle.

According to an embodiment of the present invention, in the step of providing the ceramic substrate, the ceramic substrate is further connected electrically to two electrodes.

DETAILED DESCRIPTION

In order to make the structure and characteristics as well as the effectiveness of the present invention to be further understood and recognized, the detailed description of the present invention is provided as follows along with embodiments and accompanying figures.

In the specifications and subsequent claims, figures and various embodiments are used for illustrating the present invention in detail. Nonetheless, instead of being limited to the provided exemplary embodiments, the concepts disclosed by the present invention can be embodied in various forms. In addition, the same symbol elements can represent similar components.

Figure 1:
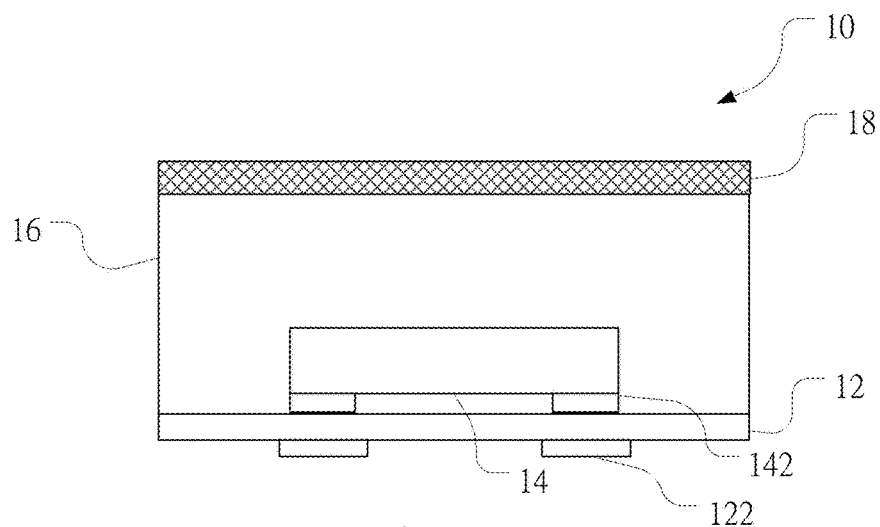
FIG. 1 shows a structural schematic diagram according to a preferred embodiment of the present invention.
Figure 2:
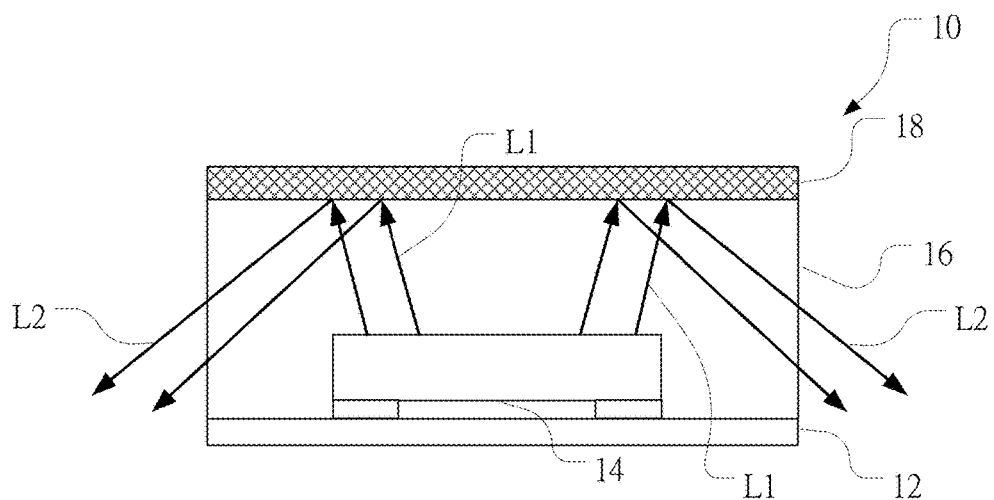
FIG. 2 shows a schematic diagram of reflection according to a preferred embodiment of the present invention.

First, please refer to FIG. 1, which shows a structural schematic diagram according to a preferred embodiment of the present invention. As shown in FIG. 1, the present invention provides an LED package structure 10 having a plane light source, in which the LED package structure 10 comprises a ceramic substrate 12, a UV LED chip 14, a light-guiding layer 16, and a metal reflective layer 18. According to the present embodiment, preferably, the ceramic substrate 12 further includes two electrodes 122; the UV LED chip 14 further includes two connecting pads 142. The UV LED chip 14 is disposed on the ceramic substrate 12. In particular, the UV LED chip 14 is disposed on the ceramic substrate 12 via the connecting pads 142. The light-guiding layer 16 covers the UV LED chip 14. Besides, the metal reflective layer 18 is disposed on the light-guiding layer 16 and covers there. As shown in FIG. 2, according to the LED package structure 10 of the present invention, the LED light emission L1 of the UV LED chip 14 is guided to the metal reflective layer 18 via the light-guiding layer 16 and then reflected outwards to the lateral side of the LED package structure 10, namely, to one side of the UV LED 14, by the metal reflective layer 18.

Figure 3A:
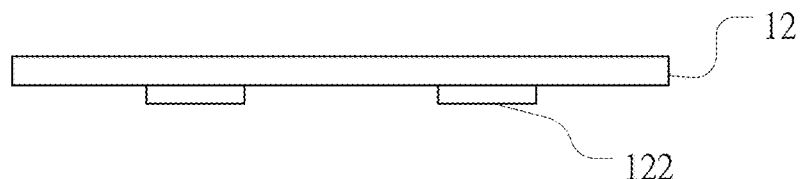
FIGS. 3A to 3D show schematic diagrams of steps according to a preferred embodiment of the present invention.
Figure 3B:
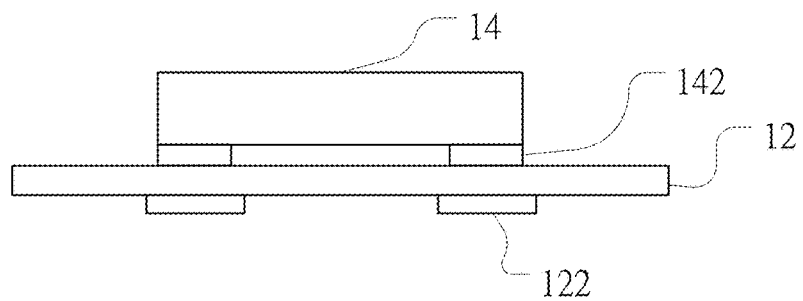
Figure 3C:
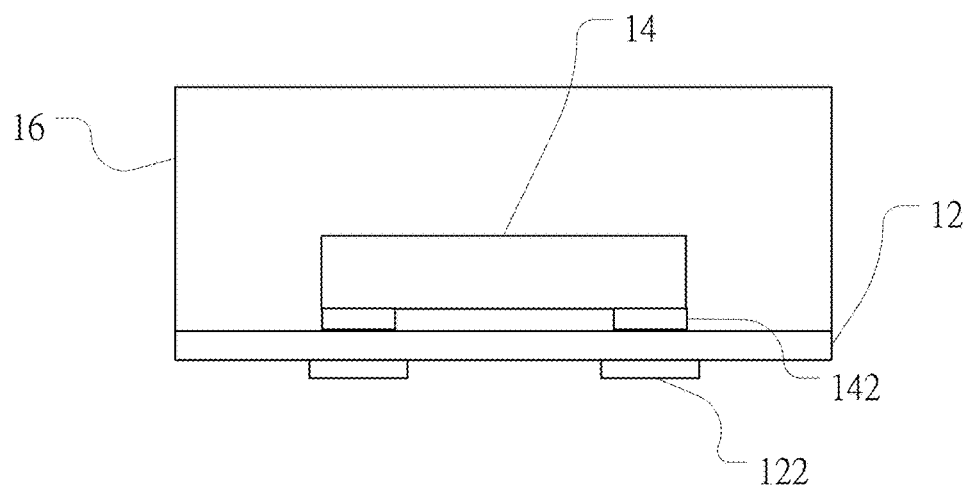
Figure 3D:
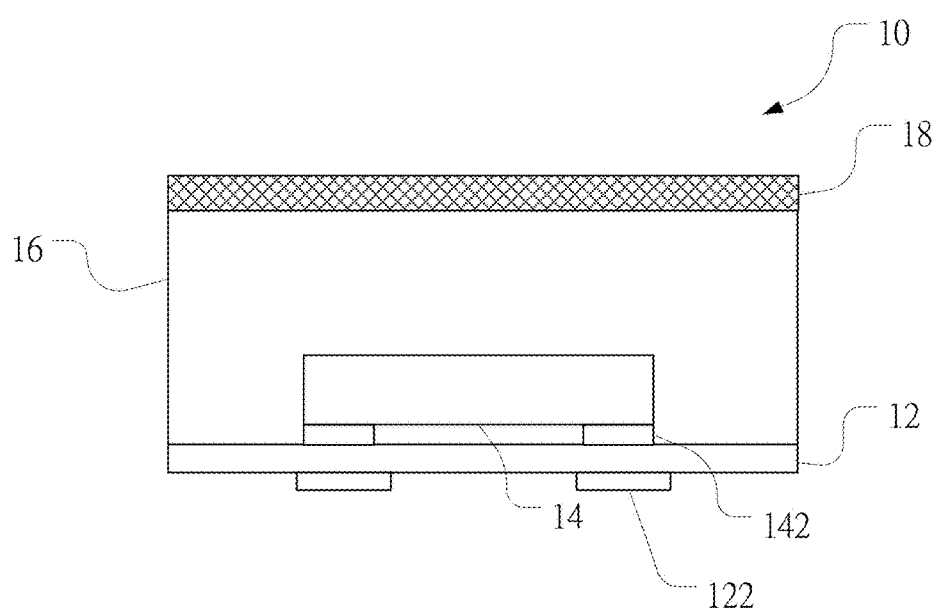
Figure 4:
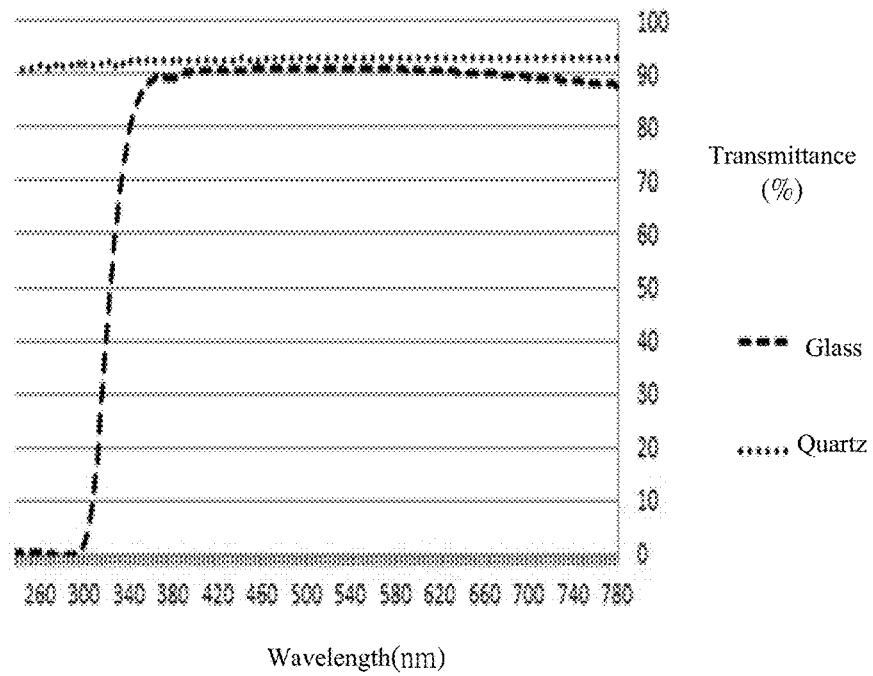
FIG. 4 shows transmittance curves of quartz and glass.
Figure 5:
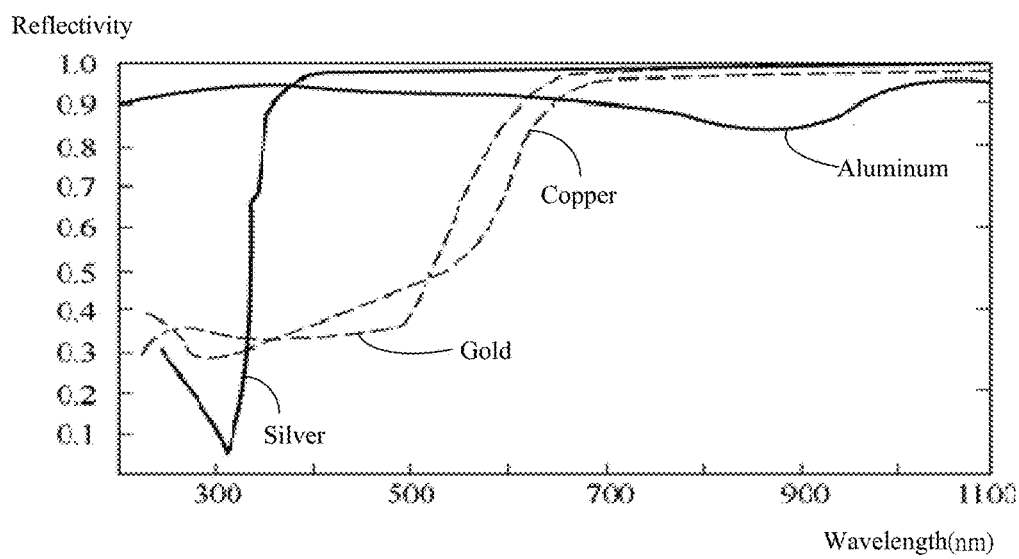
FIG. 5 shows reflectivity curves of metal reflective materials.

Please refer to FIGS. 3A to 3D, which show schematic diagrams of steps according to a preferred embodiment of the present invention. As shown in FIGS. 3A to 3D, the variations of the LED package structure 10 in the steps are illustrated. According to the method for manufacturing the LED package structure of the present invention, first, as shown in FIG. 3A, a ceramic substrate 12 is provided. As shown in FIG. 3B, a UV LED chip 14 is disposed on the ceramic substrate 12. Next, as shown in FIG. 3C, a light-guiding layer 16 is provided to cover the UV LED chip 14. Finally, as shown in FIG. 3D, a metal reflective layer 18 is provided to cover the light-guiding layer 16. In addition, according to the present embodiment, the material of the ceramic substrate 14 is selected from the groups comprising aluminum nitride, silicon carbide, beryllium oxide, aluminum oxide, and titanium oxide for their superior structural properties such as greater mechanical strength, lower welding, and having thermal expansion coefficients close to that of silicon wafers. The material of the light-guiding layer 16 is quartz. The main material of quartz is silicon dioxide, meaning superior tolerance in temperature and light transmittance. As shown in FIG. 4, the transmittance of quartz for wavelengths below 300 nanometers (nm) is better than that of glass. The material of the metal reflective layer 18 is aluminum, which is extremely excellent in reflection for light with short wavelengths. Thereby, for reflecting UV light with shorter wavelengths, the reflection performance of aluminum is outstanding. As shown in FIG. 5, compared with regular metal reflective material including gold, silver, and copper, aluminum has the best reflection performance for wavelengths below 300 nm.

Figure 6:
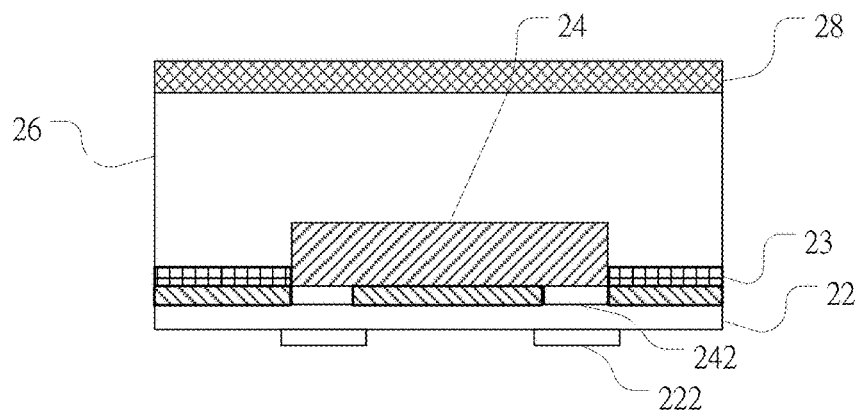
FIG. 6 shows a structural schematic diagram according to another preferred embodiment of the present invention.

Please refer to FIG. 6, which shows a structural schematic diagram according to another preferred embodiment of the present invention. The difference between FIG. 1 and FIG. 6 is that the LED package structure 20 in FIG. 6 further comprises an aluminum layer 232 and a glass glue layer 234. As shown in FIG. 6, the LED package structure 20 according to the present invention comprises a ceramic substrate 22, a UV LED chip 24, a light-guiding layer 26, a metal reflective layer28, the aluminum layer 232, and the glass glue layer 234. Preferably, the LED package structure 20 according to the present invention further comprises two electrodes 222 and two connecting pads 242. The aluminum layer 232 and the glass glue layer 234 are provided to cover the ceramic substrate 22 sequentially. The UV LED chip 24 is disposed on the aluminum layer 232. The glass glue layer 234 is located on the side of the UV LED chip 24. The light guiding layer 26 is provided to cover the glass glue layer 234 and the UV LED chip 24. That is to say, the aluminum layer 232 is disposed between the ceramic substrate 22 and the UV LED chip 24 and between the ceramic substrate 22 and the light guiding layer 26. In addition, the glass glue layer 234 is disposed between the aluminum layer 232 and the light guiding layer 26 and located at one side of the UV LED chip 24.

Figure 7:
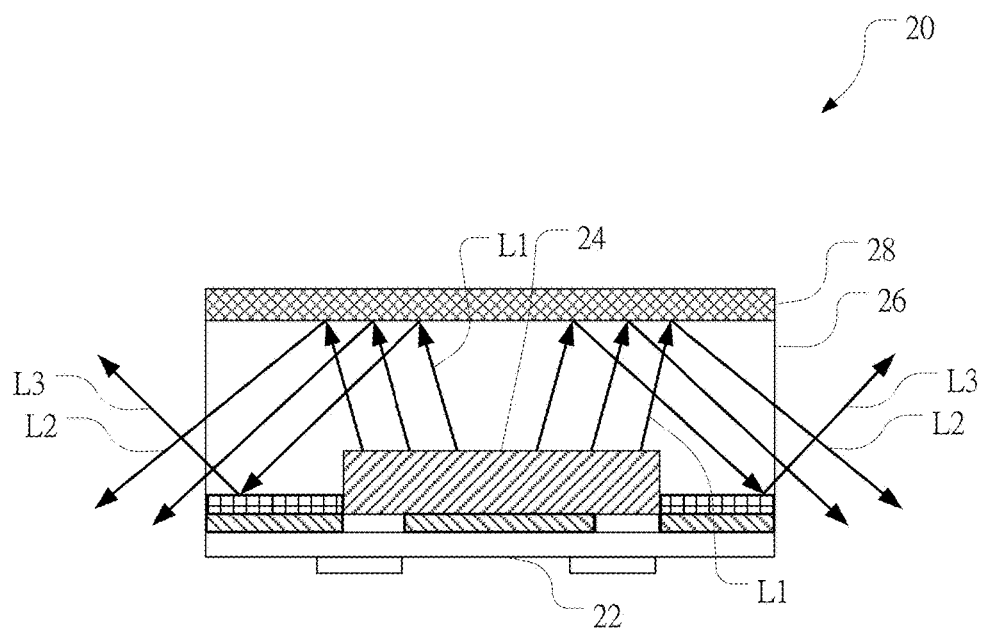
FIG. 7 shows a schematic diagram of reflection according to another preferred embodiment of the present invention.

The things unchanged between FIG. 1 and FIG. 6 are that the metal reflective layer 28 is also disposed on the light guiding layer 26 and the two electrodes 222 are connected electrically to the ceramic substrate 22. Furthermore, the UV LED 24 is disposed on the ceramic substrate 22 via the connecting pads 242 for connecting electrically to the electrodes 222. As shown in FIG. 7, according to the LED package structure 20 of the present invention, the light emission L1 of the UV LED chip 24 is guided to the metal reflective layer 28 via the light-guiding layer 26 and then reflected as primary reflection light L2 going outwards to the lateral side of the LED package structure 20 by the metal reflective layer 28. Namely, the primary reflection light L2 is reflected to one side of the UV LED 24. Besides, once the primary reflection light L2 according to the present embodiment does not form emergent light from the light guiding layer 26, the primary reflection light L2 is further reflected by the aluminum layer 232 and the glass glue layer 234 to form secondary reflection light L3 for further reflecting outwards.

Figure 8A:
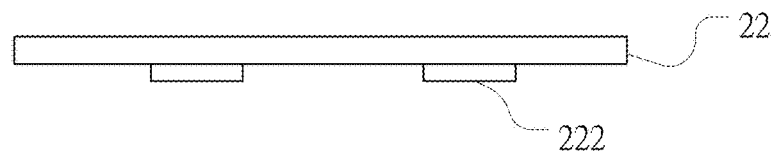
FIGS. 8A to 8F show schematic diagrams of steps according to another preferred embodiment of the present invention.
Figure 8B:
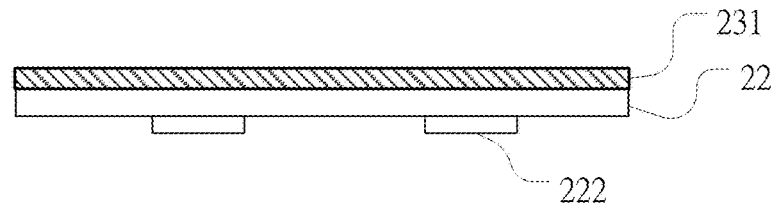
Figure 8C:
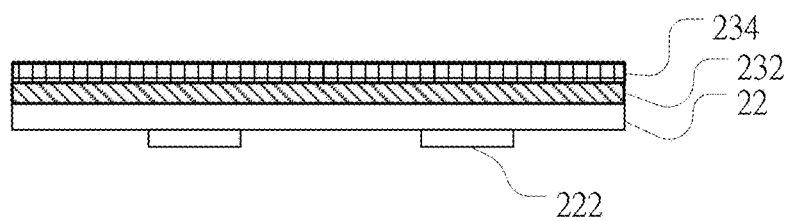
Figure 8D:
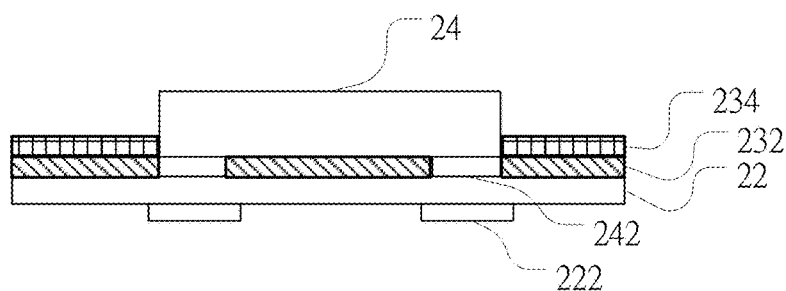
Figure 8E:
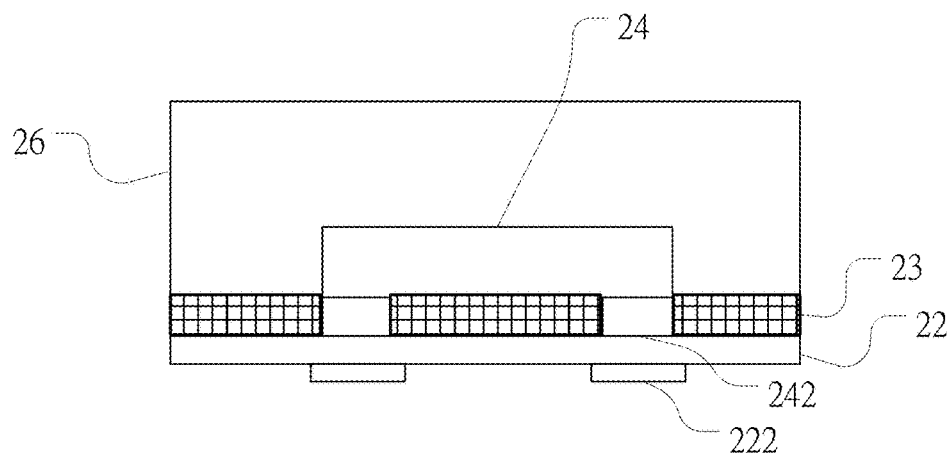
Figure 8F:
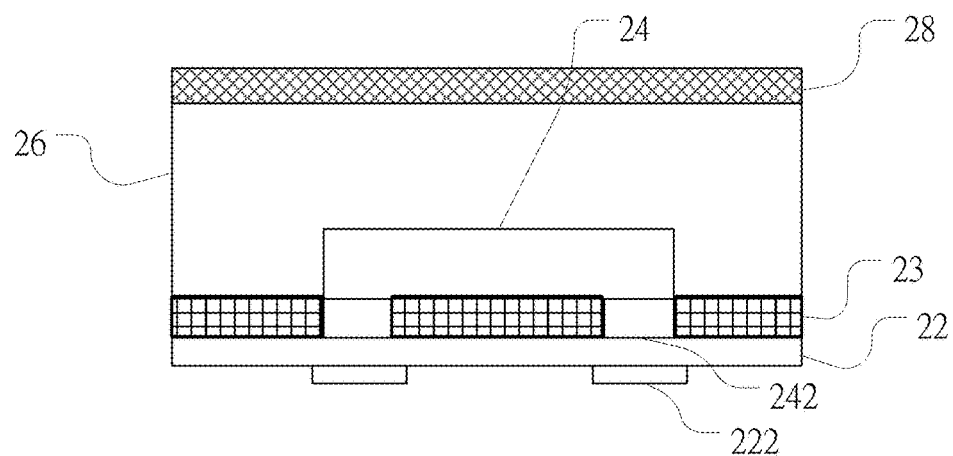

Please refer to FIGS. 8A to 8F, which show schematic diagrams of steps according to another preferred embodiment of the present invention. As shown in FIGS. 8A to 8F, the variations of the LED package structure 20 in the steps are illustrated. According to the method for manufacturing the LED package structure of the present invention, first, as shown in FIG. 8A, a ceramic substrate 22 is provided. As shown in FIG. 8B, an aluminum layer 22 covers the ceramic substrate 22. As shown in FIG. 8C, a glass glue layer 234 covers the aluminum layer 232. Next, as shown in FIG. 8D, a UV LED chip 24 is disposed on the ceramic substrate 22. In particular, the UV LED chip 24 is set on the aluminum layer 232, and the UV LED chip 24 is electrically connected with the ceramic substrate 22 via two connecting pads 242. Then, as shown in FIG. 8E, a light-guiding layer 26 is covered on the UV LED chip 24. Finally, as shown in FIG. 8F, a metal reflective layer 28 is covered on the light-guiding layer 26.

Figure 9:
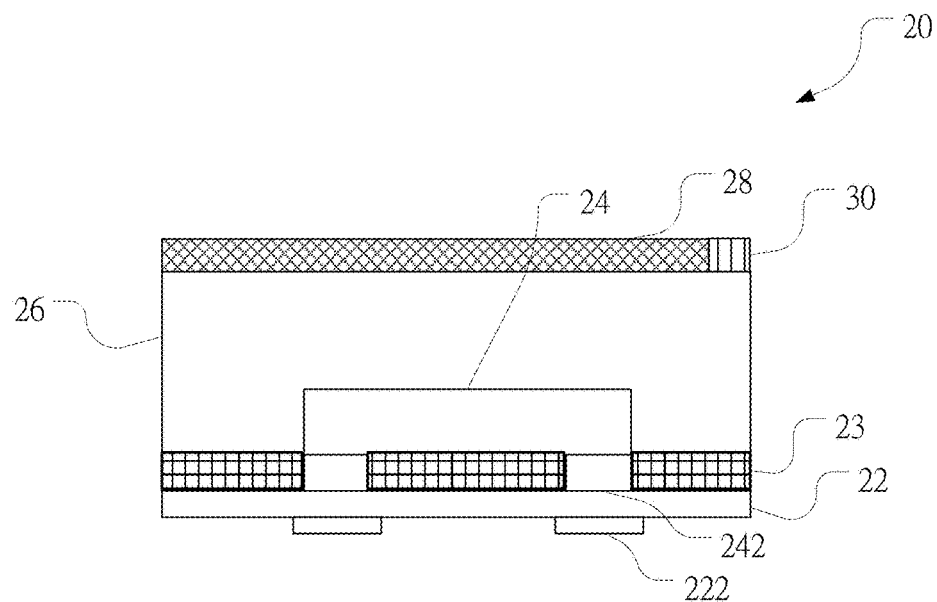
FIG. 9 shows a structural schematic diagram according to another preferred embodiment of the present invention.
Figure 10:
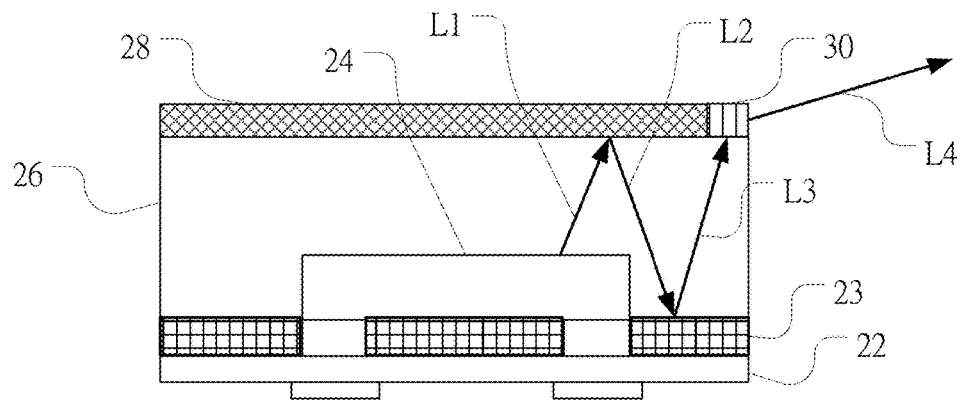
FIG. 10 shows a schematic diagram of reflection according to another preferred embodiment of the present invention.

Please refer to FIG. 9, which shows a structural schematic diagram according to another preferred embodiment of the present invention. The difference between FIG. 6 and FIG. 9 is that the LED package structure 20 in FIG. 9 further comprises a transparent member 30. As shown in FIG. 9, according to the LED package structure 20 of the present invention can further, the transparent member 30 can be disposed on the light-guiding layer 26 and located at one side of the metal reflective layer 28. The transparent member 30 is doped with at least one fluorescent particle, such as fluorescent powders comprising yttrium aluminum garnet, magnesium tungstate, calcium tungstate, and zinc silicate. As shown in FIG. 10, according to the LED package structure 20 of the present invention, the transparent member 30, doped with fluorescent powders, can be used to convert the UV light, which is invisible, to visible light, such as green, blue-green, or red light, so that users can see or find out the lighting direction of the invisible light with ease.

Figure 11A:
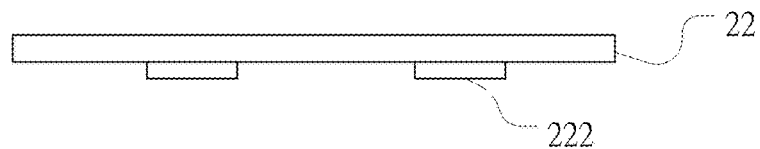
FIGS. 11A to 11G show schematic diagrams of steps according to another preferred embodiment of the present invention.
Figure 11B:
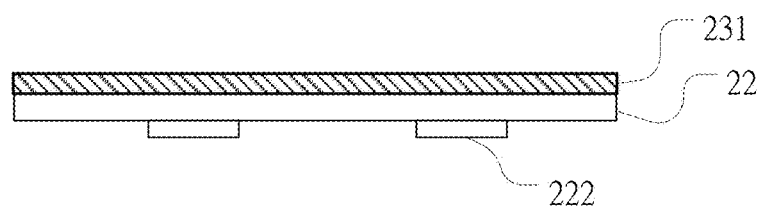
Figure 11C:
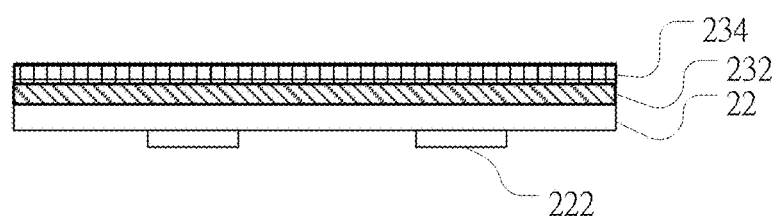
Figure 11D:
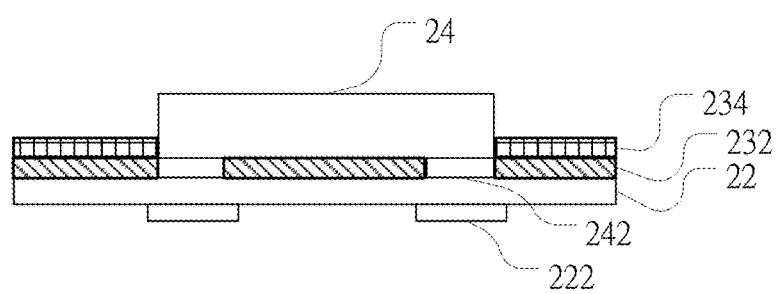
Figure 11E:
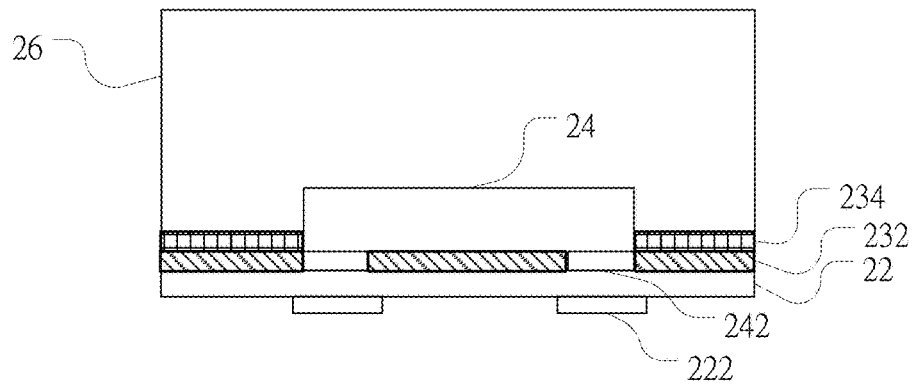
Figure 11F:
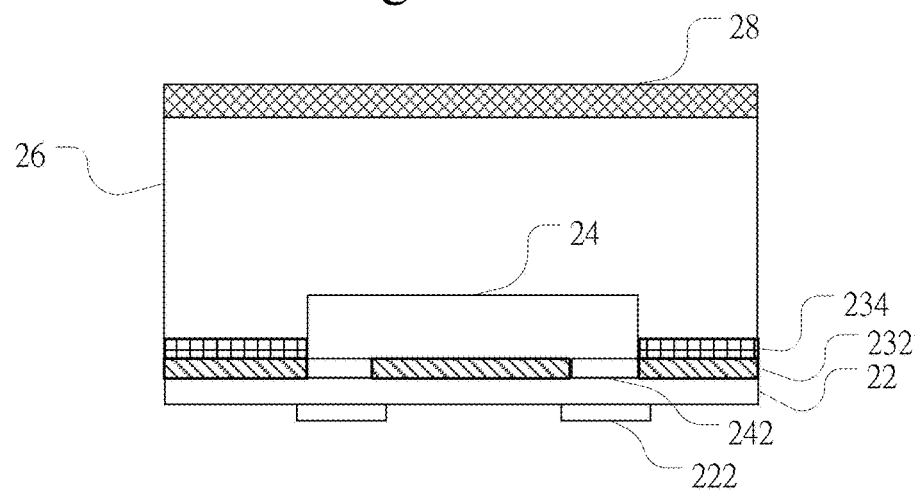
Figure 11G:
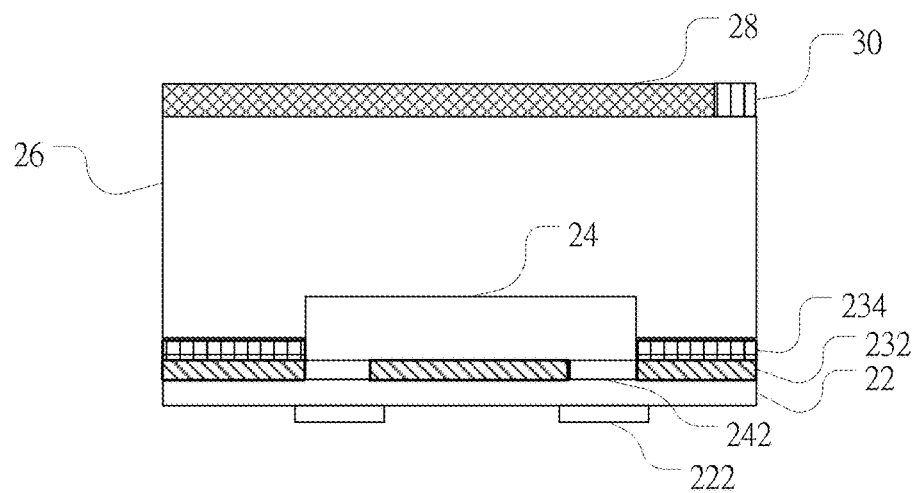

Please refer to FIGS. 11A to 11G, which show schematic diagrams of steps according to another preferred embodiment of the present invention. As shown in FIGS. 11A to 11Q the variations of the LED package structure 20 in the steps are illustrated. In particular, the difference between FIG. 8A to FIG. 8F and FIGS. 11A to 11G is that the latter further include FIG. 11G which is a step for disposing the transparent member 30. FIGS. 11A to 11F are identical to FIGS. 8A to 8F. Hence, the details will not be described again. As shown in FIG. 11G the transparent member 30 is disposed on the light-guiding layer 26 and located at one side of the metal reflective layer 28.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

What is claimed is:
1. A light-emitting diode package structure, comprising:
a ceramic substrate;
an aluminum layer, disposed on said ceramic substrate;
an ultraviolet light-emitting diode chip, disposed on said aluminum layer, and producing ultraviolet light;
a glass glue layer, adjacent to said ultraviolet light-emitting diode chip and covered said aluminum layer;
a light-guiding layer, covered said ultraviolet light-emitting diode chip and said aluminum layer; and
a metal reflective layer, covered said light-guiding layer, and said ultraviolet light guided to said metal reflective layer via said light-guiding layer and reflected from said metal reflective layer to one side of said ultraviolet light-emitting diode.
2. The light-emitting diode package structure of claim 1, further comprising two electrodes connected electrically to said ceramic substrate.
3. The light-emitting diode package structure of claim 1, further comprising a transparent member disposed on the light-guiding layer and located at one side of metal reflective layer, the transparent member doped with at least one fluorescent particle.
4. The light-emitting diode package structure of claim 1, wherein said ultraviolet light-emitting diode chip is a flip-chip light-emitting diode.
5. A method for manufacturing a light-emitting diode package structure, comprising steps of:
providing a ceramic substrate;
providing an aluminum layer covering said ceramic substrate;
disposing an ultraviolet light-emitting diode chip on said ceramic substrate;
providing a light-guiding layer covering said ultraviolet light-emitting diode;
providing a glass glue layer covering said aluminum layer and being adjacent to said ultraviolet light-emitting diode; and
providing a metal reflective layer covering said light-guiding layer.
6. The method for manufacturing of claim 5, further comprising a step of disposed a transparent member on said light-guiding layer, and said transparent member located at one side of said metal reflective layer, the transparent member doped with at least one fluorescent particle.
7. The method for manufacturing of claim 5, wherein said ceramic substrate is further connected electrically to two electrodes in said step of providing said ceramic substrate.

* * * * *